United States Patent
Kelly

(10) Patent No.: US 8,670,608 B2
(45) Date of Patent: Mar. 11, 2014

(54) 3D ATOMIC SCALE IMAGING METHODS

(75) Inventor: Thomas F. Kelly, Madison, WI (US)

(73) Assignee: Cameca Instruments, Inc., Madison, WI (US)

(*) Notice: Subject to any disclaimer, the term of this patent is extended or adjusted under 35 U.S.C. 154(b) by 397 days.

(21) Appl. No.: 13/000,098

(22) PCT Filed: Jun. 18, 2009

(86) PCT No.: PCT/US2009/047827
§ 371 (c)(1),
(2), (4) Date: Dec. 20, 2010

(87) PCT Pub. No.: WO2009/155440
PCT Pub. Date: Dec. 23, 2009

(65) Prior Publication Data
US 2011/0103681 A1    May 5, 2011

Related U.S. Application Data

(60) Provisional application No. 61/074,553, filed on Jun. 20, 2008.

(51) Int. Cl.
*G06K 9/00* (2006.01)
*G06K 9/32* (2006.01)

(52) U.S. Cl.
USPC ............ 382/154; 382/131; 382/300; 977/881

(58) Field of Classification Search
None
See application file for complete search history.

(56) References Cited

U.S. PATENT DOCUMENTS

| 6,641,705 B2 | 11/2003 | Phaneuf et al. |
| 2007/0184515 A1 | 8/2007 | Goodman et al. |
| 2010/0204927 A1 | 8/2010 | Geiser et al. |
| 2010/0288926 A1 | 11/2010 | Wiener et al. |

FOREIGN PATENT DOCUMENTS

| WO | WO 2007/112408 A2 | 10/2007 |
| WO | WO 2007/121325 A2 | 10/2007 |

OTHER PUBLICATIONS

Geiser et al, Spatial Distribution Maps for Atom Probe Tomography, 2006, Vacuum Nanoelectronics Conference, 2006 and the 2006 50th International Field Emission Symposium., IVNC/IFES 2006. Technical Digest. 19th International, pp. 21-22.*
Arslan et al., Towards better 3-D reconstructions by combining electron tomography and atom-probe tomography, 2008, Jun. 1, 2008, Ultramicroscopy, pp. 1-26.*
Arslan et al., Towards better 3-D reconstructions by combining electron tomography and atom-probe tomography, Ultramicroscopy, Jun. 1, 2008 [Jul. 20, 2009]. Retrieved from internet: <URL:http://www.sciencedirect.com/science?_ob=PublicationURL&_tockey=%23TOC%1235549%232008%23998919987%23699306%23FLA%23&_cdi=5549&_pubType=J&view=c&_auth=y&_acct=C000050221&version=1&_urlVersion=0&_userid=10&md5=ee5e127db779ae7720adb9821abc1c46>Abstract.
M.K. Miller, Atom Probe Tomography: Analysis at the Atomic Level, Kluwer Academic/Plenum Press (2000), pp. 152-155, 166-171, 182-187 and 192-195.

(Continued)

*Primary Examiner* — Barry Drennan
*Assistant Examiner* — David F Dunphy
(74) *Attorney, Agent, or Firm* — Craig A. Fieschko, Esq.; DeWitt Ross & Stevens S.C.

(57) ABSTRACT

The present invention is directed generally toward atom probe and TEM data and associated systems and methods. Other aspects of the invention are directed toward combining APT data and TEM data into a unified data set. Other aspects of the invention are directed toward using the data from one instrument to improve the quality of data obtained from another instrument.

12 Claims, 9 Drawing Sheets

(56) References Cited

OTHER PUBLICATIONS

D.B. Williams and C.B. Carter, Transmission Electron Microscopy, Plenum Press, NY (2006), pp. 485-489.

J. Radon, Uber die Bestimmung von Funktionen durch ihre Intergralwerte langs gewisser Mannigfaltigkeiten (On the determination of functions from their integrals along certain manifolds), Ber. Sachs. Akad. Wissenschaft, vol. 69, pp. 262-267 (1917).

C. Kubel et al., Recent Advances in Electron Tomography: TEM and HAADF-STEM Tomography for Materials Science and Semiconductor Applications, Microsc. Microanal. 11, 378-400 (2005).

C.B. Boothroyd, Why don't high-resolution simulations and images match?, Journal of Microscopy, vol. 190, pp. 99-108 (1998).

B. Gorman et al., Atomic Scale Compositional and Structural Characterization of Nanostructured Materials Using Combined FIB, STEM, and LEAP, Microsc. Microanal 12(Supp 2), pp. 1720-1721 (2006).

E. J. Kirkland, Advanced Computing in Electron Microscopy, Chapters 5, 6 and 7, pp. 77-113, 115-161 and 163-197, Plenum, New York (1998).

\* cited by examiner

3D ATOMIC SCALE IMAGING METHODS

CROSS-REFERENCE TO RELATED APPLICATION(S)

This application claims the benefit of U.S. Provisional Patent Application No. 61/074,553, filed Jun. 20, 2008, entitled A METHOD FOR DATA PROCESSING, VISUALIZATION, QUANTIFICATION, AND SIMULATION OF 3D ATOMIC-SCALE IMAGES, which is incorporated herein by reference in its entirety.

TECHNICAL FIELD

The present disclosure is related generally to methods to combine atom probe data and TEM/STEM data into a unified dataset that can be used to derive both data (qualitative and quantitative) and images at the atomic scale. In addition techniques to utilize data obtained from one instrument to improve the data obtained from another instrument are described.

BACKGROUND

An atom probe (e.g., atom probe microscope) is a device which allows specimens to be analyzed on an atomic level. For example, a typical atom probe includes a specimen mount, a counter or local electrode, and a detector. During analysis, a specimen is carried by the specimen mount and a positive electrical charge (e.g., a baseline voltage) is applied to the specimen. The detector is spaced apart from the specimen and is either grounded or negatively charged. The counter electrode is located between the specimen and the detector, and is either grounded or negatively charged. A positive electrical pulse (above the baseline voltage) and/or a laser pulse (e.g., photonic energy) are intermittently applied to the specimen. Alternately, a negative voltage pulse can be applied to the electrode. Occasionally (e.g., one time in 10 to 100 pulses) a single atom is ionized near the tip of the specimen. The ionized atom(s) separate or "evaporate" from the surface, pass though an aperture in the electrode, and impact the surface of the detector, typically a micro channel plate (MCP). The elemental identity of an ionized atom can be determined by measuring its time of flight (TOF) from the surface of the specimen to the detector, which varies based on the mass-to-charge-state ratio (m/z) of the ionized atom. The location of the ionized atom on the surface of the specimen can be determined by measuring the location of the atom's impact on the detector. Accordingly, as the specimen is evaporated, a three-dimensional map of the specimen's constituents can be constructed. While the process is considered a point-projection with extremely high magnification (approximately×1 million) the resultant data can be analyzed in virtually any orientation, hence can be considered more tomographic in origin.

Difficulties associated with atom probe tomography (APT) include but are not limited to detector efficiency, trajectory aberrations, non-uniform magnification, limited or non-existent a priori information regarding compositions and interface morphologies and the like.

Since the atom probe process is destructive the dynamics of the specimen evaporation and erosion process complicate device operation issues as well as data reconstruction. If a specimen includes multiple layers of different atomic species, then the induced fields can result in either preferential evaporation in specific regions or specimen fracture. Further, as the specimen tip erodes, the evolution of the tip shape further complicates both the control of the field magnitude as well as the reconstruction of the resultant data.

Atom probe data reconstruction problems are exacerbated by all of the aforementioned effects. Even if the typical detection efficiency of around 50% was somehow improved to >95% the other aberrations and magnification errors could seriously degrade the resultant data. As such, a number of corrections are made to the raw and intermediate data in order to obtain useful output data. A full discussion of the issues can be found in Atom Probe Tomography: Analysis at the Atomic Level by M. K. Miller, Kluwer Academic/Plenum Press (2000), which is incorporated herein by reference.

Transmission electron microscopy (TEM) is a technique wherein electrons are transmitted through a very thin specimen and the interactions between the electrons and the specimen are detected by various means. TEM images can resolve individual atoms but are considered projection by nature. It is typically non-destructive and can be performed on specimens prior to the destructive atom probe procedure, thus creating two unique and complementary data sets from the same specimen. For a discussion of TEM refer to Transmission Electron Microscopy, D. B. Williams and C. B. Carter, Plenum Press, NY (2006), which is incorporated herein by reference.

Scanning transmission electron microscopy (STEM) differs from TEM in that the electron beam is swept across the specimen, rather than held in one place. Other techniques include high resolution transmission electron microscopy (HRTEM) and a host of other variants. As used herein, the acronym TEM or TEM/STEM generally refers to all of these techniques unless specifically noted.

SUMMARY

The present invention is directed generally toward atom probe and TEM data and associated systems and methods. Other aspects of the invention are directed toward combining APT data and TEM data into a unified data set. Other aspects of the invention are directed toward using the data from one instrument to improve the quality of data obtained from another instrument.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 4D corresponds to a thin slice through the origin of (c); FIG. 4E corresponds to a thin slice through the first layer above (d); and FIG. 4F corresponds to the second layer up above (d).

DETAILED DESCRIPTION

Figure 1:
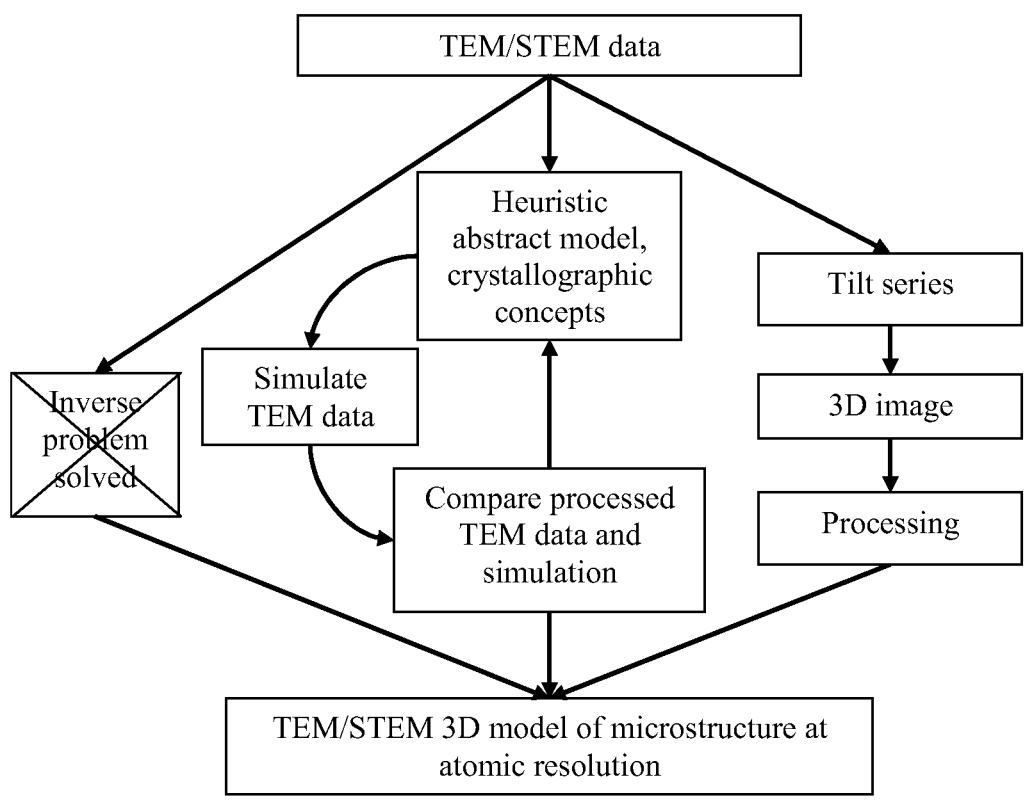
FIG. 1 is a flowchart of three possible paths for processing the raw 2D TEM/STEM data into an atomic-resolution 3D model of microstructure with atomic resolution.
Figure 2:
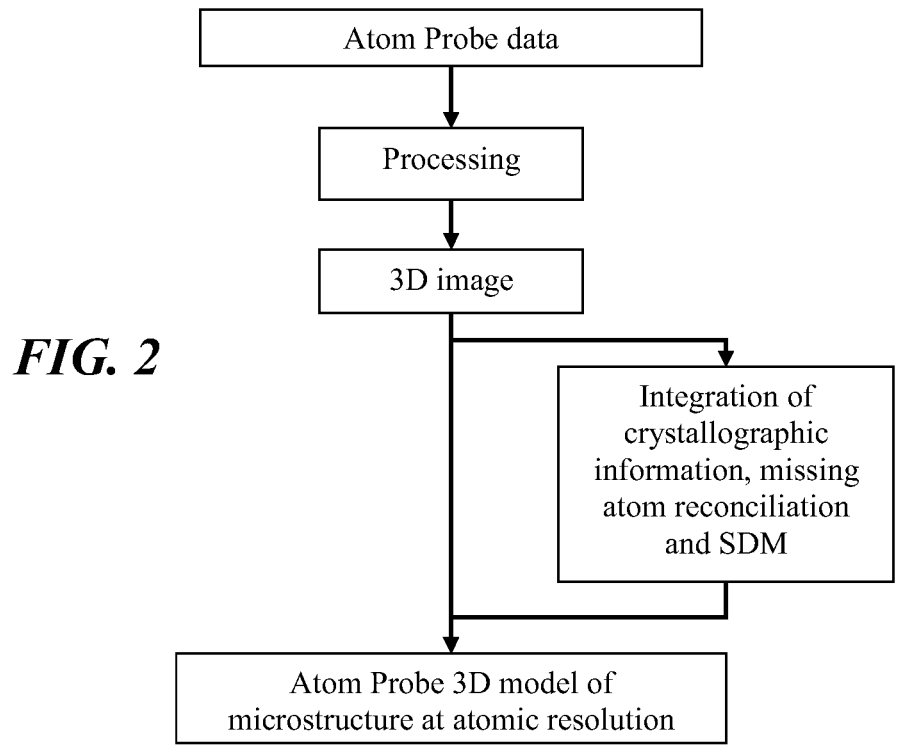
FIG. 2 is a flowchart of the path for processing the raw Atom Probe data into an atomic-resolution 3D model of the microstructure.
Figure 3:
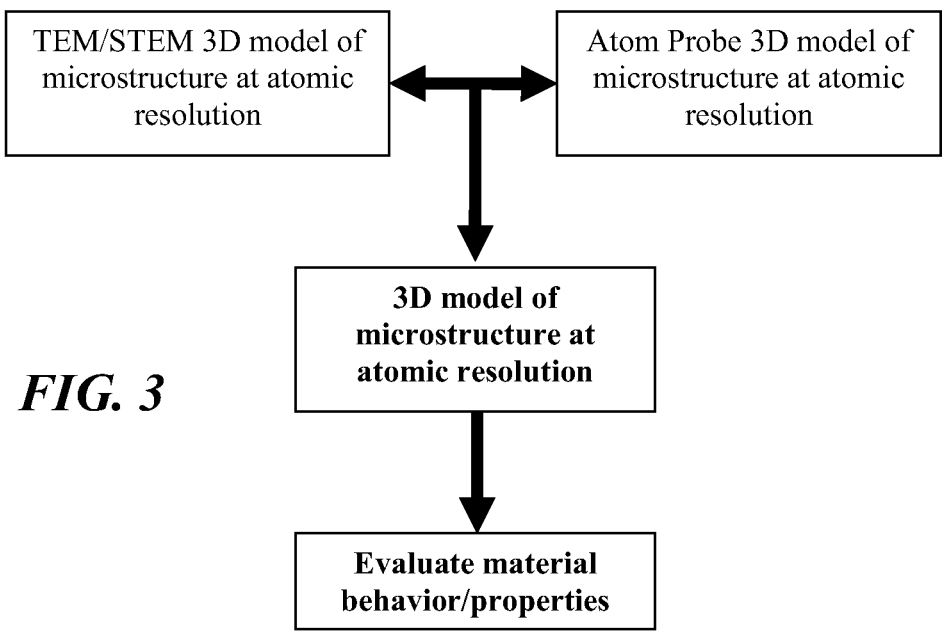
FIG. 3 is a flowchart of the consolidation of the TEM/STEM and Atom Probe 3D models of the microstructure so that the behavior and properties of the material can be evaluated in accordance with the teachings of the present specification.

FIGS. 1-3 are flowcharts that characterize a technique to achieve 3D structural visualization at atomic resolution. The current state of the art of TEM and LEAP tomography efforts in each area are summarized in FIGS. 1 and 2. These TEM and APT efforts can be correlated with top-level visualization software in each area. For example, the Amira and Xplore3D software package, distributed by FEI Inc. of Hillsboro, Oreg., is representative of tomography capabilities for TEM. The Imago Visualization and Analysis Software (IVAS) from Imago Systems of Madison, Wis., represents tomography capabilities for the atom-probe community. Due to their inherently different physical approaches, these two software packages cannot presently exchange input data—the Xplore3D and Amira software uses 2D mass-density-related data as input, whereas IVAS uses a 3D input corresponding to atom positions and identity. Despite the fact that TEM/STEM has routinely produced 2D atomic-resolution images and APT produces 3D images of atom positions, neither technique alone reaches the ultimate goal of recording the position and identity of every atom on a routine basis for different reasons (reviewed below).

TEM has two essential handicaps in reaching the ultimate goal: the "inverse problem" and the "projection criterion" shown in FIG. 1. If the inverse problem could be solved, then the electron wave, as it leaves the specimen and is recorded by arbitrary means, could be time-reversed on a computer. This means the electron path could be traced backwards through the specimen until the wave becomes the illumination of the specimen again. During this process, the 3D structure at atomic resolution would be revealed. This reversal is more generally known as an "inverse problem" which is an area of intensive research. No known general solutions to this problem currently exist. For these reasons, the box "Inverse problem solved" in FIG. 1 is crossed out.

Due to the different physical approach of APT to 3D atomic-scale imaging, there is no "inverse problem," nor must the recorded signal vary strictly monotonically with material thickness. Atom probe data already provide direct access to structural evaluation and classification, however not quite at the desired atomic resolution.

The projection criterion is valid for existing tomographic imaging approaches, which require the acquisition of a tilt series, including, e.g., X-ray tomography. It was derived in Radon's original paper titled "Ueber die Bestimmung von Funktionen durch ihre Intergralwerte laengs gewisser Mannigfaltigkeiten (On the determination of functions from their integrals along certain manifolds)," Berichte Saechsischer Akademie der Wissenschaften, vol. 29, pp. 262-277, 1917, which is included herein by reference, and applies to all present tomographic approaches. As discussed in detail in the paper by C. Kuebel et al. titled "Recent Advances in Electron Tomography: TEM and HAADF-STEM Tomography for Materials Science and Semiconductor Applications", Microsc. Microanal. 11, 378-400, 2005, which is included herein by reference, the "projection criterion" states that "At the very least . . . the recorded signal must vary strictly monotonically with (mass) thickness." Monotonic behavior is clearly not found for strongly scattering crystalline materials in bright-field TEM, especially not along major zone axes. Even for high-angle, annular-dark-field STEM where the image intensity is a linear function of the projected sample thickness because of Rutherford scattering rather than diffraction contrast, channeling effects along the major zone axes contribute significantly to the image, and as a result, the images that provide the highest atomic resolution are generally excluded from the tilt series. Furthermore, as pointed out in Kuebel et al., the "missing wedge" of information and the "finite angular sampling" pose additional limits to tomographic resolution which is today around 1 to 2 nm. Therefore, present-day tomography or tilt-series techniques shown in the rightmost route in FIG. 1 can provide a 3D-model display for structural evaluation and classification, but not at atomic resolution, as indicated in FIGS. 1 to 3.

Although phase-contrast images acquired along a major zone axis resist extraction of their 3D information, software for high-resolution image simulation has been a major aspect of atomic-resolution TEM. A feature that is common to this type of commercial software is an atomic-scale model based on a priori crystallographic knowledge.

From such a model, the experimental images for a specific TEM/STEM are calculated and the resulting simulated images are compared to the experimental images. The model is refined iteratively until an acceptable match between simulated and experimental images is found as is shown in the central route of FIG. 1, as described in the paper by C. B. Boothroyd titled "Why don't high-resolution simulations and images match?", Journal of Microscopy, Vol. 190, Pts 1/2, April/May 1998, pp. 99-108, which is included herein by reference.

As seen in FIG. 2, an analogous approach can also be used in APT. A model of the specimen may be prepared and then the APT image may be simulated and compared with data. The model is then refined iteratively until an acceptable match is found. In both the TEM/STEM and APT image simulation enterprises, there is no guarantee that a good match will be found. Nor is there a guarantee that if a good match is found in either approach, that the model is an accurate representation of the specimen. What is needed is additional information in each case to constrain the problem to the point that a single correct solution is obtained. TEM/STEM data can provide this input for APT and vice versa.

Atom probe data can be transformed to a "best fit" lattice by "post-processing" it using information obtained by other means including TEM, SEM and the like. For example in a paper titled "Atomic Scale Compositional and Structural Characterization of Nanostructured Materials Using Combined FIB, STEM, and LEAP", which is included herein by reference, Gorman et al. have used TEM images to determine specimen diameters and shank angles as well as d-spacing to improve atom probe reconstruction efforts.

In accordance with the teachings herein, atom probe data and software can be utilized to improve TEM data, specifically methods used to simulate TEM images. In one embodiment, data sets from the atom probe software platform are converted to a format that is commensurate with TEM simulation software. In one application they can reduce the amount of time required to generate the TEM structural models and increase the accuracy of said models. In this embodiment, atom probe data sets can be used to "seed" the creation of the TEM image simulations and provide much needed compositional information as well as identify crystallographic information.

Further, crystal defects and interfaces can be identified in the atom probe data and greatly reduce the time to simulate the TEM image as well as improve the sensitivity. Further still atom probe data can be used to identify fiducials and determine reference planes or zones to assist in optimizing TEM image simulation. In yet another embodiment atom probe data can be used to determine unit cell size and composition, zone axes and other fundamental crystallographic information to greatly improve TEM image simulation.

The route to the ultimate goal of visualizing and classifying materials at the atomic level in 3D, shown in FIG. 3, combines the crystallographic aspects of FIG. 1 and FIG. 2 and puts the tomographic capabilities of, e.g., FEI's Amira/Xplore3D software at a comparable level with IVAS, despite the fact that they are based on very different principles.

Just as TEM/STEM encounters obstacles in reaching the ideal tomography goal, so do APT obstacles limit its spatial resolution. The limitations are distinct from TEM/STEM and are detailed in Miller, the two most significant limitations being collection efficiency and reconstruction artifacts.

While the collection efficiency of APT is about 50% and thus about every other atom is missing in the structural model it does not suffer from "the missing wedge" phenomenon. The collection efficiency is limited primarily by the detection efficiency of the microchannel plate (MCP) amplifiers that detect the ions. This is not a fundamental limitation, but no workable technology has yet been developed to increase this detection efficiency to 100% while maintaining spatial resolution. Conversely TEM data includes information about all of the atoms illuminated by the electrons within the imaged field, except those contained in "the missing wedge". In one embodiment, the TEM data can be used to augment the APT data and provide information to fill in some of the missing atoms, and conversely APT data can be used to fill in "the missing wedge".

Figure 4A:
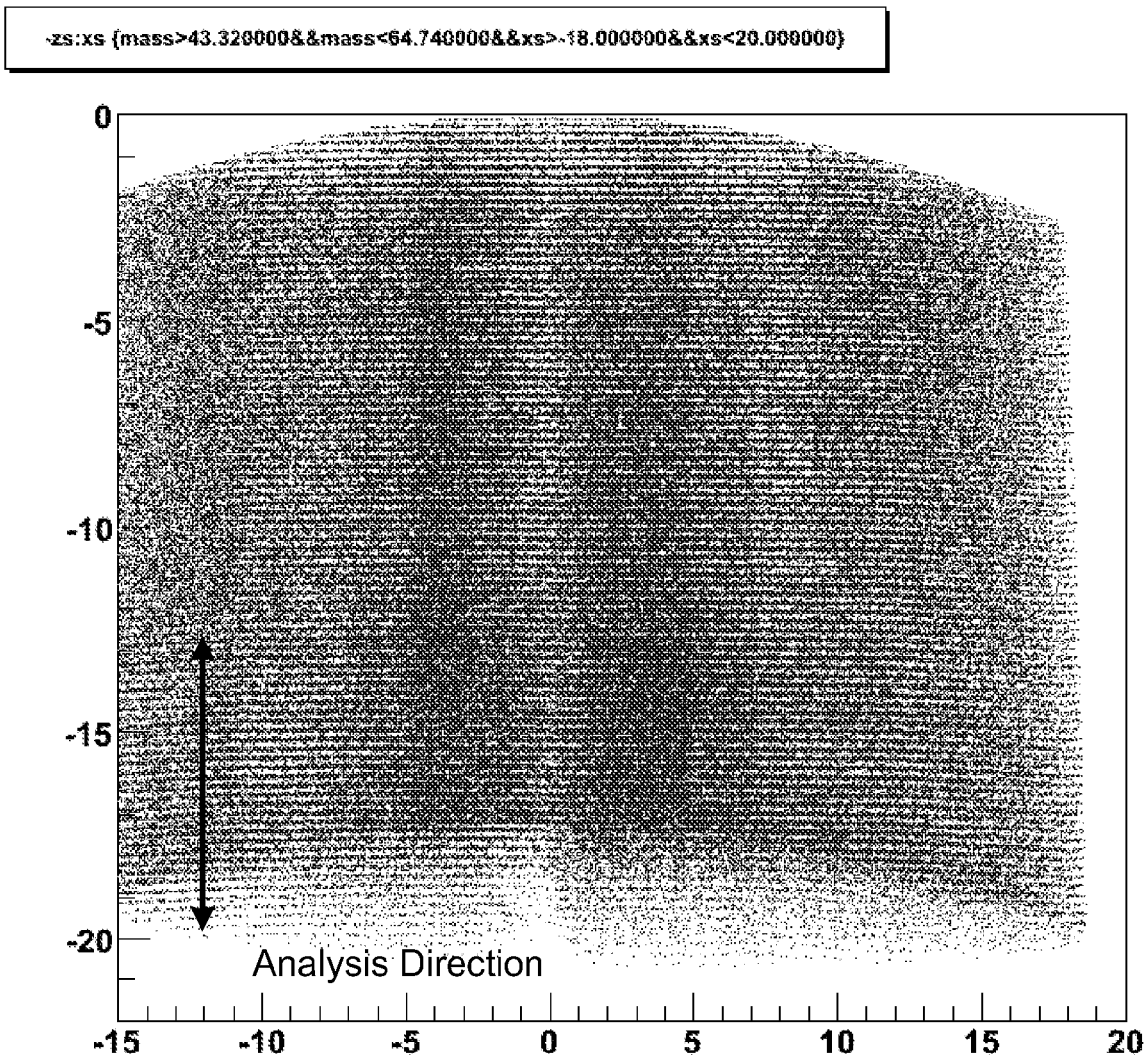
FIG. 4A is a side view of a thin slice through a 3D tomograph of tungsten where the atomic planes are apparent.
Figure 4B:
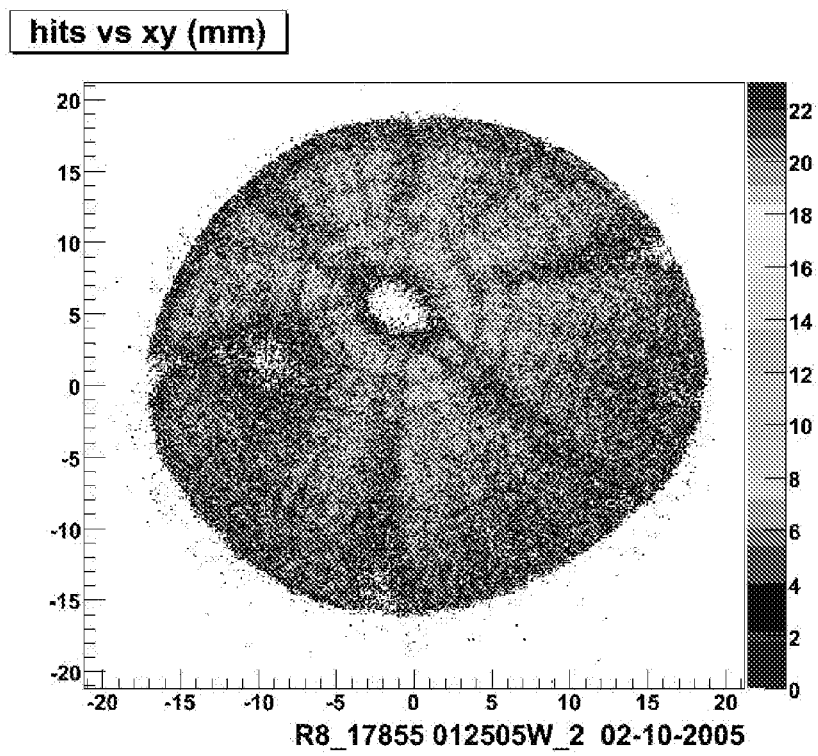
FIG. 4B is a top view of 2D cumulative field-evaporation histogram of tungsten showing the presence of a <110> zone axis and zone lines.
Figure 4C:
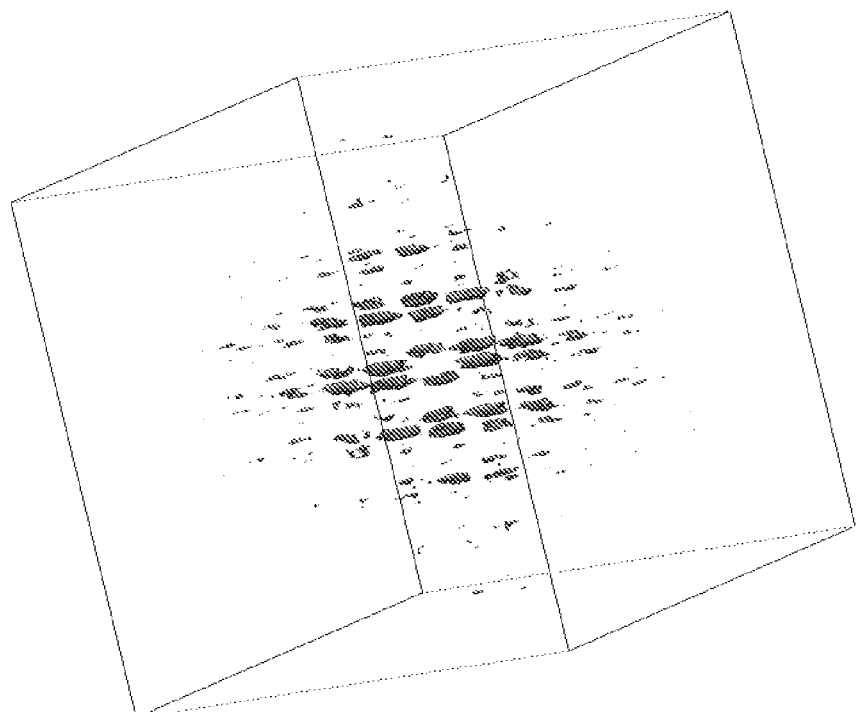
FIG. 4C is a 3D view of the spatial distribution map of the entire image in (a) and (b). Iso-intensity surfaces surround each intensity maximum for clarity.
Figure 4D:
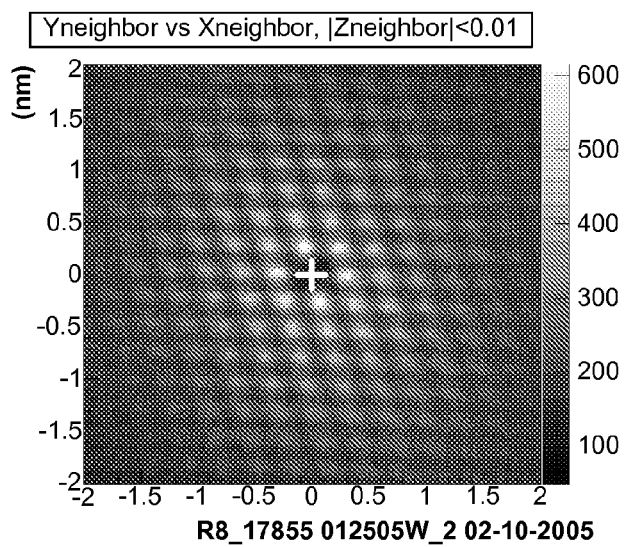
FIGS. 4D-4F are 2D slices through (c) normal to <110> showing spatial periodicities evident.
Figure 4E:
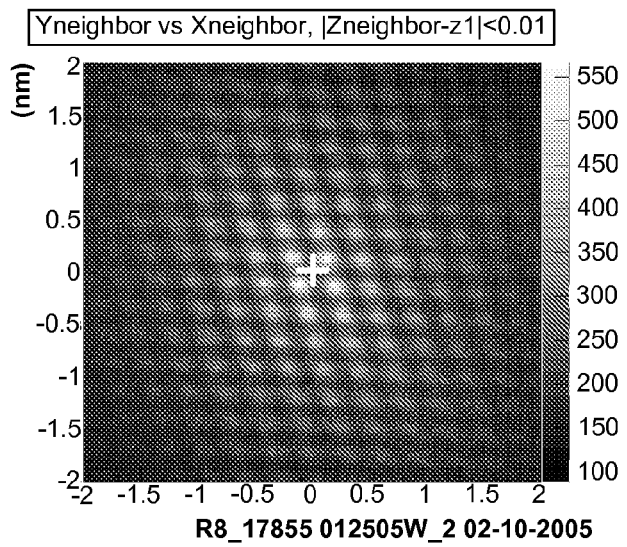
Figure 4F:
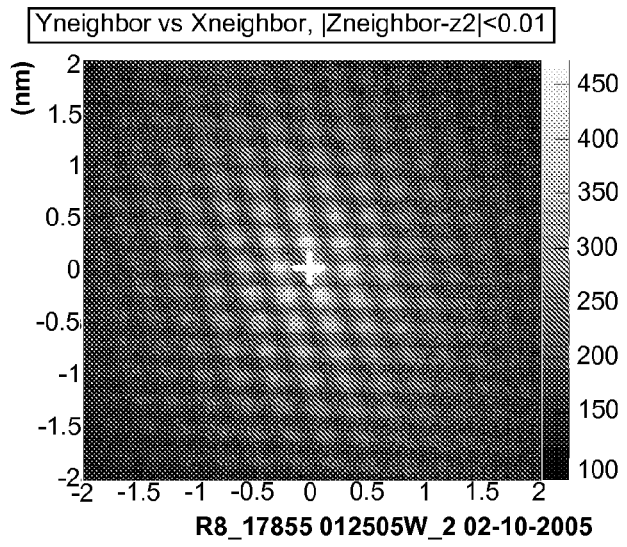

Reconstruction artifacts often manifest themselves along zone axes of crystalline specimens. It is common that atomic planes are visible in APT data obtained from crystalline materials whose atomic-plane normals are within a few degrees of the direction of analysis (FIG. 4a). Other atomic planes are generally unresolved because of trajectory aberrations normal to the analysis direction that are caused by faceting of the specimen at low-index crystal orientations. FIG. 4b is a cumulative field-evaporation histogram (often also called field desorption images) viewed down the analysis direction. The image would be uniform in intensity if there were no trajectory aberrations. The reason that the zone axis and zone lines are visible in this image is due to small trajectory aberrations that displace atoms away from facets that form at close-packed surfaces near zone axes and zone lines. Despite these aberrations, the crystal structure of the tungsten specimen is clearly resolved, as illustrated by the Spatial Distribution Map (SDM™) developed at Imago Scientific Instruments Corp., FIGS. 4c-f. The <110> zone axis of the tungsten specimen is visible near the center of FIG. 4b. The SDMs reveal the presence of atomic periodicities, which lie on a body-centered cubic real-space lattice. This result demonstrates that very high spatial resolution can indeed be available in atom probe data.

The SDM is discussed in PCT Application No. US2007/066570, Attorney Docket No. 39245-8018.WO00, filed Apr. 12, 2007, which is fully incorporated herein by reference. The SDM utilizes a high degree of signal averaging. For any atom, i, in a three-dimensional list, the relative positions of its nearest neighbors out to some arbitrary distance (e.g., 4 nm×4 nm×4 nm for an approximately 4000 atom data set) are recorded as a three-dimensional histogram. The process is repeated for all atoms in the list which can be large and leads to the high degree of signal averaging. When there is a periodic placement of atoms in the list, intensity maxima will appear in the three-dimensional histogram. The intensity maxima correspond to a heightened probability of finding an atom at the location of the maximum. For crystals, the centroids of the maxima correspond to atom positions in real space. The three-dimensional lattice can be identified from the loci of maxima in the histogram. The width of the maxima is a measure of the average deviation from the lattice position. This deviation can vary with direction and location in the data and may be used as a measure of the spatial resolution in the dataset. Any angular deviation of the lattice axes is a measure of the distortion of the data. This information may be used to correct the data (for example, the reconstruction parameters in an atom probe may be altered to fix the deviation). The length of the inter-lattice spacings can be scaled to known values for the crystal as a means of calibrating the reconstructed image from an atom probe. The SDM can be used for multiple elements in ordered structures. For example, the SDM for nickel (Ni) and aluminum (Al) in a nickel-aluminum (NiAl) structure has been computed to reveal the ordering in the lattice.

Figure 5A:
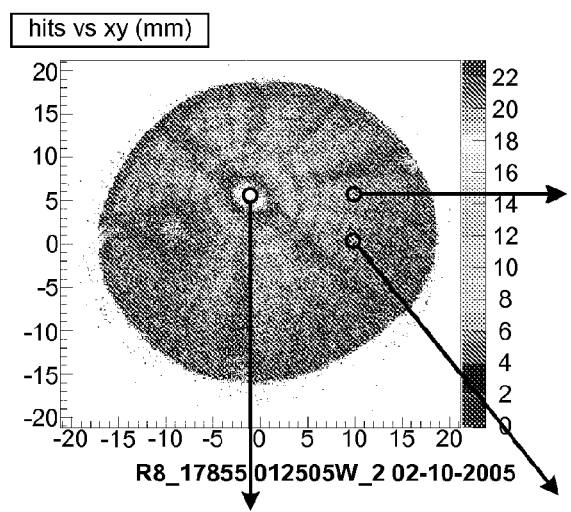
FIG. 5A is a 2D cumulative field evaporation histogram of tungsten shown in FIG. 4B. The circles correspond to the size of the sampled range for the local Spatial Distribution Map (SDM).
Figure 5C:
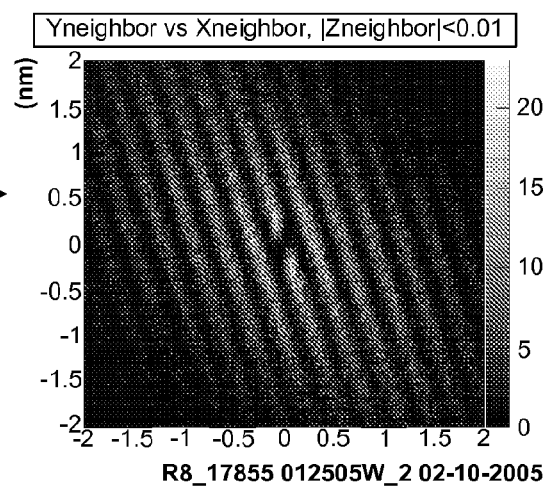
FIG. 5C is a local SDM at the location marked which is close to a zone line.
Figure 5B:
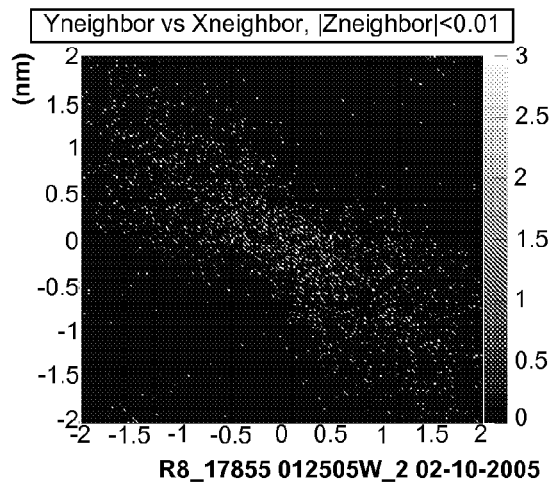
FIG. 5B is a local SDM at the <110>.
Figure 5D:
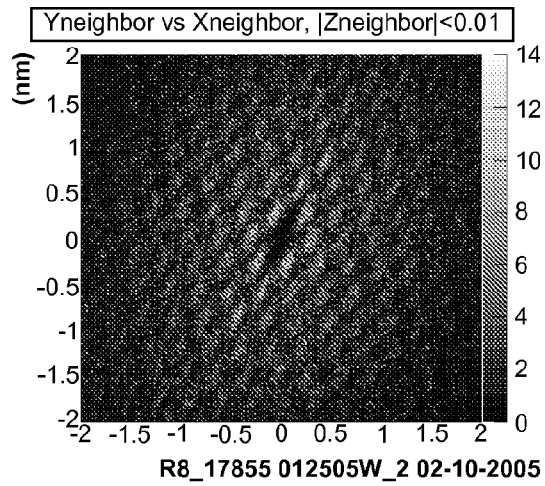
FIG. 5D is a local SDM at the location marked which is part way between zone lines.

In one embodiment, the SDM can be used to map and quantify the aberrations in an APT image. Local SDMs shown in FIG. 5b-d clearly depict the nature and magnitude of the aberrations. This ability to quantify the aberrations in the field-evaporation process is new and has important implications for the future of atomic-scale imaging with APT. Because we can now see and quantify the aberrations, the prospects for improving the resolution of the technique are strong. This development is comparable in importance to the advent of aberration-correction technology for TEM/STEM.

Figure 6:
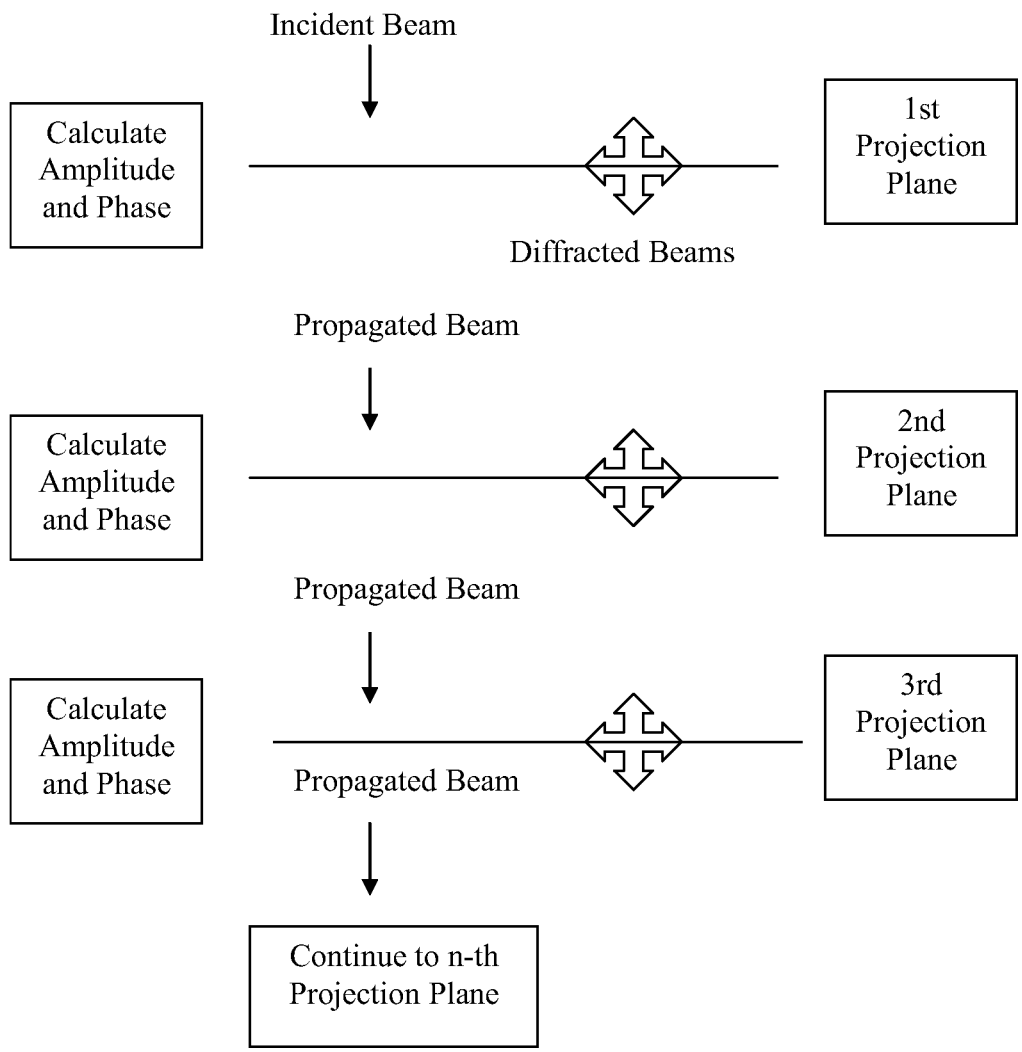
FIG. 6 is a partially schematic illustration of the multi-slice method of TEM image simulation.

In another embodiment, atom probe data sets can be converted using the SDM then sectioned or sliced into atomic planes and provide information to augment TEM image simulation. As noted previously, while TEM data is acquired by projection techniques, atom probe data can be viewed and analyzed from a myriad of orientations. A similar concept is found in medical imaging. Standard X-ray images are projection by nature (like TEM) while CT images are inherently tomographic and can be rotated and sliced in many orientations. The multi-slice method of TEM image simulation involves calculating an approximation of how the electron beam propagates through the TEM specimen by describing it as a succession of transmissions through a series of planes (FIG. 6). In it a three-dimensional potential field of a virtual specimen is divided into N thin slices. The electron scattering caused each slice is calculated as well as the effective propagation between slices and the total bulk effect is obtained by adding the effect of each slice. A brief discussion of TEM image simulation can be found in Chapters 5, 6 and 7 of "Advanced Computing in Electron Microscopy" by E. J. Kirkland and is included, in its entirety, herein by reference. In this embodiment one can slice the atom probe data into atomic sections and convert these data into a format compatible with TEM analysis. The propagation of the electron wave can be modeled based on interaction with the atoms a priori identified within each slice by APT data rather than arbitrary slices of a virtual specimen.

Figure 7:
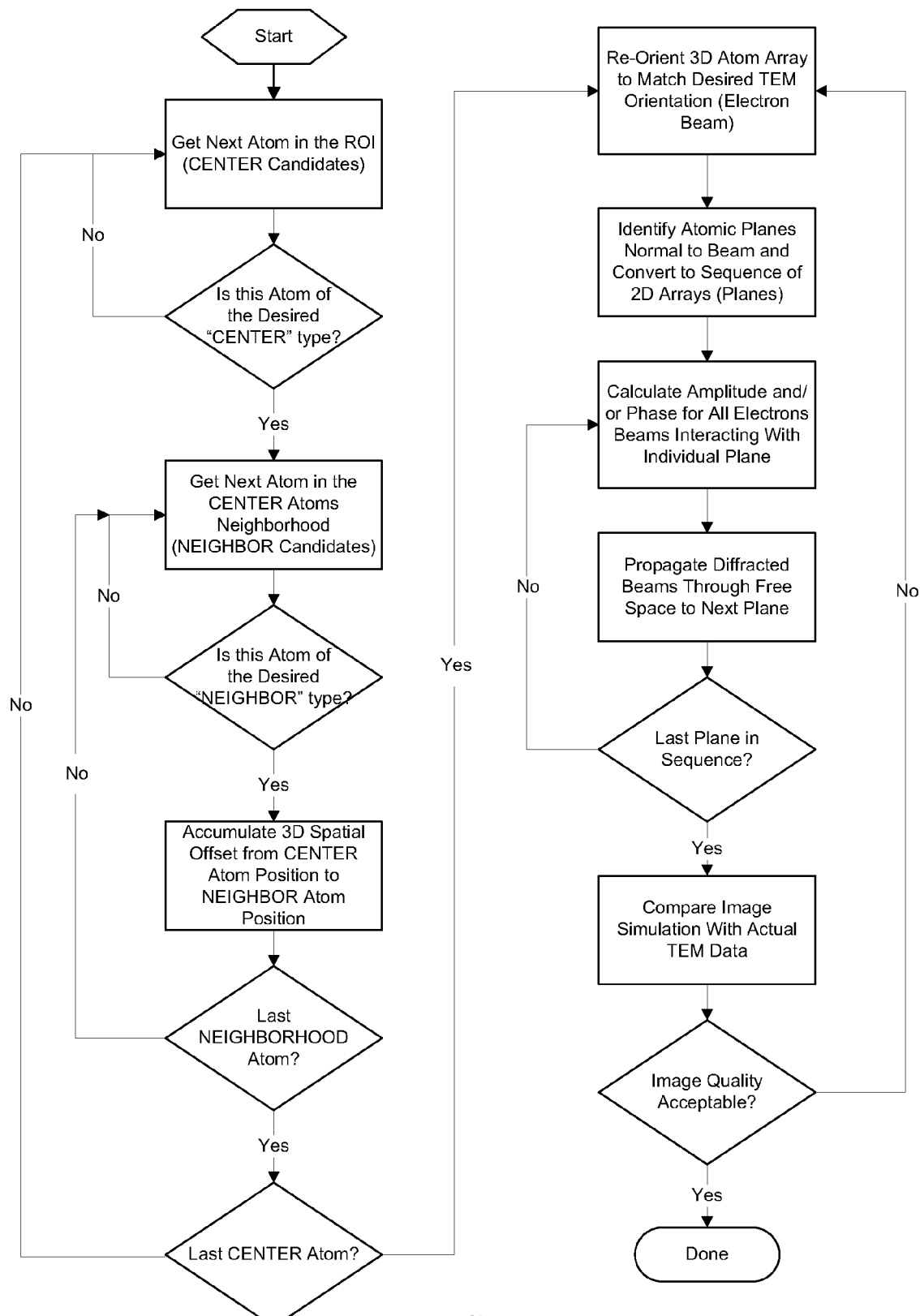
FIG. 7 is a flowchart combining the atom probe SDM process with the TEM multi-slice image simulation process.

As seen in FIG. 7, the left side of the flowchart represents the SDM process while the right side summarizes the multi-slice process. Slice dimensions can be selected if desired to match the natural periodicity of the specimen and reduce image artifacts. In addition inter-atomic distances can be derived from the APT data when combined with compositional and crystallographic information. For example one could analyze a specimen in an atom probe that was previously analyzed in a TEM and determine that a given portion of the specimen is comprised of silicon. From crystallography it has been determined that the lattice parameter for silicon is 0.543 nm and this knowledge can be utilized in the TEM image simulation process to, among other things, choose the thickness of each slice.

Specifically, turning to FIG. 7, the left side of the figure shows typical steps in generating the spatial distribution map (SDM) using an atom probe. The steps described therein are, as noted above, related to the generation of an image using atom probe tomography data. After the SDM process is completed, the three-dimensional SDM data is reoriented to match the orientation of the TEM image. Once this has been done, the atomic planes normal to the beam are identified and these atomic planes are converted into a sequence of two-dimensional rays. Next, the amplitude and/or phase of all the electron beams interacting with each of the individual two-dimensional rays are calculated. The diffracted electron beams are then propagated through free space to the next plane and this is repeated for all planes in the sequence. This image simulation is then compared with the actual TEM data as a "quality check" before it is determined that the image quality is acceptable.

Similar procedures may be used with the Bloch wave method, the calculation of Laue zones, and other simulation techniques. Chapter 29 of the Williams and Carter reference teaches "for the perfect crystal, the HRTEM may be understood simply in terms of images of Bloch waves". It further states that as few as 3 Bloch waves can yield essential features in a HRTEM zone-axis image. The Bloch waves are derived from projected potential maps based on atoms positioned at different thicknesses within the specimen.

Atom probe data obtained from crystalline specimens can be processed to "force" the detected atoms to specific sites on a crystal lattice. This "crystal corrected" data can be used to predict individual Bloch waves and provide further insight into the TEM image simulation process. In addition lattice defects can be identified in atom probe data and this information can be used to predict more accurate Bloch waves. Further, this entire process can be iterative. One can compare the atom probe data derived Bloch wave image with the TEM image simulated Bloch wave and gain insight into corrections to improve both data sets.

Another advantage of using atom probe data to augment TEM image simulation include the ability to modify the orientation of the atom probe data to obtain slices that are in precise alignment with the electron beam. One can easily rotate and or translate the atom probe image using IVAS and then extract slices that would have been normal to the electron beam. This reduces or eliminates a host of artifacts that are present in traditional multi-slice image simulation techniques.

Yet another advantage of atom probe data is that it is inherently free of the chromatic aberration that plagues TEM images. The major source of the aberration is the electron energy spread that increases with specimen thickness. In one embodiment the atom probe data can be used to provide a means to compensate for this aberration by using these aberration-free data points in the image simulation. The difference between the "raw" TEM image and the atom probe data augmented image can be used to calculate an aberration correction.

In yet another embodiment the compositional information obtained from the atom probe can be used to enhance the TEM image simulation process. For example the scattering of electrons by atoms depends on their atomic number so that phosphorus ($Z=15$) is indistinguishable from silicon ($Z=14$) in TEM imaging but they reside in fully distinct peaks in the mass spectrum in atom probe tomography. While these are relatively easy to differentiate using the atom probe they are much more difficult to identify using TEM analysis. One can use the atom probe data to identify specific atoms in a given TEM data set and improve the image contrast analysis process.

Atomic-scale tomography (AST™) will be used here to refer to the goal of achieving atomic-scale positioning and identification of every atom in a technologically useful three-dimensional volume with sufficient precision that atomic-scale structure can be determined. By reviewing these criteria for atomic-scale imaging and examining the prospects for achieving AST, the following conclusions can be reached: due to basic physical (e.g., the inverse problem) or technical (e.g., limited cone and finite atom-collection efficiency) limitations, none of the discussed methods by itself is believed to deliver the ultimate goal of atomic-resolution tomography starting from experimental data alone. Any technique appears to require prior information about the specimen. We examined three basic cases laid out in FIGS. 1 to 3 and assert:

1. High-resolution electron microscopy along a major zone axis requires a priori crystallographic information about the specimen to define the input for the simulated 3D structure.
2. Electron tomography via tilt series does not provide atomic resolution because of the "projection criterion," as well as the "missing wedge" and "finite angular sampling."
3. The atom probe provides limited atomic resolution and limited atom-collection efficiency because of experimental parameters, some of which are dependent on the specimen under analysis.

A unified data format for exchange of information between TEM/STEM and APT would take into account information that is relevant for a certain volume element, as for example EELS or X-ray spectroscopy data from the TEM. An additional complexity arises when trying to deal with the missing atom problem when using an atom probe data set, for example, as input to a high-resolution image-simulation package. Rather than focus efforts on defining a unified data format designed to allow easy exchange of data between different applications and platforms, we argue that the exchange of information between related applications may be more effectively enabled by the support for and development of import/export plug-ins on an as-needed basis. Ultimately a unified data format may become the preferred embodiment.

As the IVAS software already handles arbitrary atom positions by assigning atoms to coordinates with floating point values, it will be able to accept data from almost any environment after providing the necessary import/export capabilities. The desire to obtain from uncertain atomic positions an accurate structural model will drive the largest part of the software development effort of IVAS. Currently under development is the implementation of crystallographic concepts to be embedded on variable-sized volumes within the available 3D data set. This is a key development, as it will enable significant refinement of the experimental data from LEAP including direct local atom position refinement, explicit handling of atom probe collection efficiency of <100 percent and exporting of sub-volumes to commercial high resolution image simulation software. In addition it will allow refinement of the heuristic structural models, imported from commercial software to refine predictions of experimental data from TEM/STEM as well as merging of heuristic structural models from commercial TEM/STEM simulation software into sub-volumes of LEAP data sets.

Figure 8:
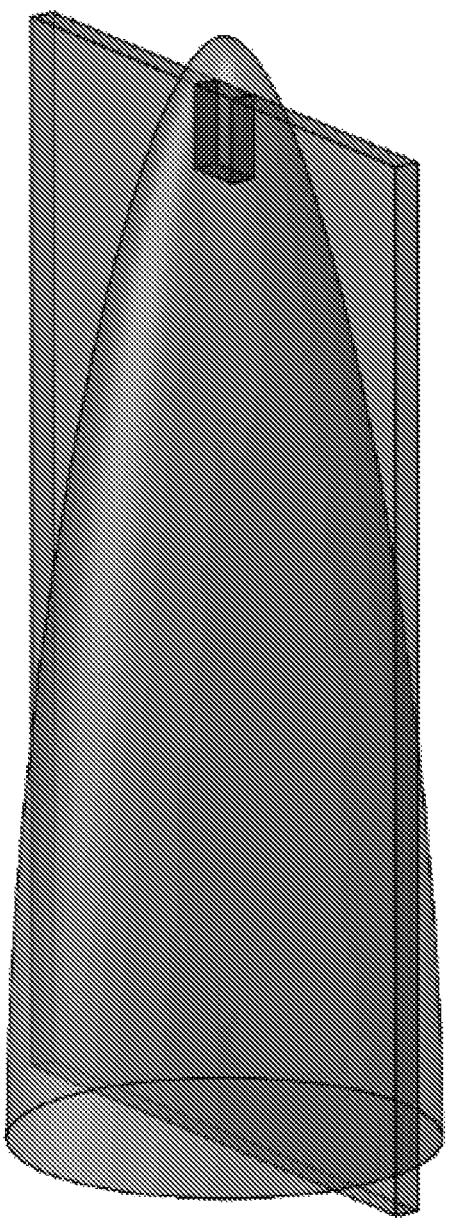
FIG. 8 is a partially schematic illustration of the comparison of the sizes of typical specimen data volumes in APT and HRTEM.

TEM/STEM techniques provide highly accurate atomic positions for critical, small volumes, whereas APT provides large-volume atomic resolution capability at slightly reduced atomic position accuracy. FIG. 8 compares the large-volume of a typical atom probe specimen (large cone) with the small volume of a TEM specimen (small box near the tip of the specimen). IVAS software can provide an interface for exchange of data between these environments. The current IVAS implementation allows for point and sphere atom-map rendering displays that can be overlaid with iso-surfaces and has integrated compositional (concentration grid) analysis.

The ability for the end-user to customize the analysis parameters and methods incorporated in the software package, and to develop additional analysis programs that operate on either TEM or APT data (or both) within the IVAS environment is critical. IVAS already has this basic capability integrated into the design through support for scripting to interact with data and analysis objects. The IVAS infrastructure must be able to support new capabilities needed for TEAM data.

The development of a platform-independent software suite to describe atom positions in three dimensions is necessary to facilitate the exchange and analysis of AST data. This software suite must take into consideration:

The ability to carry experimental details (instrument parameters, specimen characteristics, etc.).

Uncertainties in atomic positions and elemental identities that arise from different sources of data (TEAM, LEAP, simulation output, etc.).

Data storage efficiency. The format should be able to accommodate 100M ion (and larger) data sets in a manner that utilizes disk space efficiently and allows for high processing throughput.

A binary format must deal with the endian formats of different processors and software systems (little endian vs. big endian).

The scalability and extensibility necessary to meet the evolving needs and capabilities of each of the modalities.

The excellent lateral resolution of the latest aberration-corrected TEM/STEM instruments cannot be matched by atom-probe instruments in the foreseeable future, nor can TEM/STEM match the chemical composition mapping and depth resolution of the atom probe. Software that can integrate the information generated by TEM/STEM with the information generated by atom probe and provide visualization of the result is of great utility.

Furthermore, a software package that can integrate the two physically-separate technologies also can help in the refinement of the atom-probe data. Such a software package takes advantage of, for example, crystallography-related concepts consistently used for high-resolution TEM/STEM, and embedding them in the reconstruction process for atom-probe data. For example, the TEM/STEM data may be used to constrain the global geometry of the reconstructed APT image and set length scaling in the image. TEM/STEM data may also be used as input to an atomic model that is then used to simulate the APT image in, for example, silicon. Conversely, the data sets generated from the atom probe could, after refinement by incorporating crystallographic concepts, provide input for the simulation routines of high-resolution TEM/STEM data. Further this process can be repeated any number of times resulting in improved data for both APT and TEM. Ultimately, a model emerges that is consistent with both atom-probe data and TEM/STEM data. This model might then be used for simulating and understanding the macroscopic behavior of advanced nano-materials.

In all of the previously described embodiments it was implied that the same specimen was first analyzed using a TEM, then destructively analyzed with an atom probe. It should be noted that separate specimens could be used in some embodiments. In one example, if the original material is doped silicon (or some other material), then separate specimens can be formed from the same base material or region, e.g. the gate of a transistor. Independent analysis with TEM and the atom probe can be performed and the resultant data can still be augmented. The atom probe can be utilized to determine the dopant composition and distribution as well as basic crystal structure information (e.g. lattice parameter) and this data can provide fundamental information for the TEM image simulation process.

From the foregoing, it will be appreciated that specific embodiments of the invention have been described herein for purposes of illustration, but that various modifications may be made without deviating from the invention. Additionally, aspects of the invention described in the context of particular embodiments may be combined or eliminated in other embodiments. Although advantages associated with certain embodiments of the invention have been described in the context of those embodiments, other embodiments may also exhibit such advantages. Additionally, not all embodiments need necessarily exhibit such advantages to fall within the scope of the invention. Accordingly, the invention is not limited except as by the appended claims.

I claim:

1. A method of constructing a three-dimensional specimen image including the steps of:
  a. obtaining a Transmission Electron Microscopy (TEM) image of a TEM specimen, the TEM image containing data relating to the position of atoms within the TEM specimen;
  b. obtaining an Atom Probe Tomography (APT) image of an APT specimen, the APT specimen being different from the TEM specimen, the APT image containing data relating to:
    (1) the position of atoms within the APT specimen, and
    (2) the composition of atoms within the APT specimen;
  c. generating a three dimensional image from the TEM image and the APT image, the three dimensional image depicting a specimen with atomic resolution.

2. The method of claim 1 wherein the TEM specimen and the APT specimen are defined by different sections of an object to be analyzed.

3. The method of claim 1 wherein the three dimensional image depicts atoms having:

a. atom locations assigned at least partially on the basis of the atom position data from the TEM image, and
b. atom compositions assigned at least partially on the basis of the atom composition data from the APT image.

4. The method of claim 1 further including the steps of:
   a. identifying atoms missing within the APT image on the basis of the position of atoms within the TEM image, and
   b. depicting atoms within the three dimensional image at the locations of the atoms missing within the APT image.

5. The method of claim 1 further including the steps of:
   a. identifying atomic planes within the APT image, wherein the planes are at least substantially perpendicular to the paths of electron beams used to obtain the TEM image;
   b. quantifying the distances between atoms in the three dimensional image based on the identified atomic planes.

6. The method of claim 5 wherein the step of identifying atomic planes within the APT image includes:
   a. generating a data set representing atom positions in three dimensions from the APT image, and
   b. identifying atomic planes within the data set, wherein the distances between atoms in the three dimensional image are derived from distances between atomic planes within the data set.

7. The method of claim 1 further including the steps of:
   a. identifying crystals within one or both of the TEM specimen and the APT specimen on the basis of one or both of the TEM image and the APT image; and
   b. modifying the position of at least some of the atoms within the three dimensional image on the basis of atom locations defined by the identified crystals.

8. A method of constructing a three-dimensional specimen image including the steps of:
   a. obtaining a Transmission Electron Microscopy (TEM) analysis of a TEM specimen;
   b. obtaining an Atom Probe Tomography (APT) analysis of an APT specimen, wherein the TEM specimen and the APT specimen are different specimens;
   c. enhancing one of the TEM analysis and the APT analysis on the basis of the other analysis, wherein the enhanced analysis contains atoms having:
      (1) positions defined by one or more of the TEM analysis and the APT analysis, and
      (2) compositions defined by one or more of the TEM analysis and the APT analysis.

9. The method of claim 8 further including the step of displaying a three dimensional image of a specimen with atomic resolution, the three dimensional image being defined by the enhanced analysis.

10. The method of claim 8 wherein the TEM specimen and the APT specimen are defined by different sections of an object to be analyzed.

11. The method of claim 8 further including the steps of:
   a. identifying atomic planes within the APT image, wherein the planes are at least substantially normal to the paths of electron beams used to obtain the TEM image;
   b. quantifying the distances between atoms in the three dimensional image based on the identified atomic planes.

12. The method of claim 11 wherein the step of identifying atomic planes within the APT image includes:
   a. generating a data set representing atom positions in three dimensions from the APT image, and
   b. identifying atomic planes within the data set representing atom positions in three dimensions,
   wherein the distances between atoms in the three dimensional image are derived from distances between atomic planes within the data set representing atom positions in three dimensions.

* * * * *